United States Patent [19]

Hoshi

[11] Patent Number: 4,952,826
[45] Date of Patent: * Aug. 28, 1990

[54] SIGNAL INPUT CIRCUIT UTILIZING FLIP-FLOP CIRCUIT

[75] Inventor: Katsuji Hoshi, Tokyo, Japan

[73] Assignee: NEC Corporation, Tokyo, Japan

[ * ] Notice: The portion of the term of this patent subsequent to Nov. 15, 2005 has been disclaimed.

[21] Appl. No.: 201,987

[22] Filed: Jun. 3, 1988

Related U.S. Application Data

[63] Continuation-in-part of Ser. No. 882,563, Jul. 7, 1986, Pat. No. 4,785,206.

[30] Foreign Application Priority Data

Jul. 5, 1985 [JP] Japan ................... 60-148639

[51] Int. Cl.[5] ..................... H03K 3/356; H03K 3/013; H03K 17/04; H03K 19/01
[52] U.S. Cl. ..................... 307/530; 307/279; 307/291; 365/203; 365/205
[58] Field of Search ................ 307/272.1, 272.2, 291, 307/292, 304, 446, 448, 279, 530; 365/189, 203, 205

[56] References Cited

U.S. PATENT DOCUMENTS

| | | | |
|---|---|---|---|
| 4,396,845 | 8/1983 | Nakano | 365/205 |
| 4,397,000 | 8/1983 | Nagami | 307/269 |
| 4,417,163 | 11/1983 | Otsuki et al. | 365/203 |
| 4,442,365 | 4/1984 | Nagami et al. | 307/291 |
| 4,458,337 | 7/1984 | Takemae et al. | 365/189 |
| 4,542,306 | 9/1985 | Ikeda et al. | 307/272.1 |

Primary Examiner—Stanley D. Miller
Assistant Examiner—Tai V. Duong
Attorney, Agent, or Firm—Sughrue, Mion, Zinn, Macpeak & Seas

[57] ABSTRACT

A signal input circuit of a type in which an input signal voltage is compared with a reference voltage is disclosed. A first gate is connected in series with a first input transistor between a first terminal of an input amplifier comprising a flip-flop circuit and a reference terminal. A second gate is connected in series with a second input transistor between a second terminal of the input amplifier and the reference terminal. The first and second gates are controlled by potentials at third and fourth terminals of the input amplifier. The input terminals of an output amplifier are coupled to the first and second terminals of the input amplifier to provide output signals.

7 Claims, 5 Drawing Sheets

SIGNAL INPUT CIRCUIT UTILIZING FLIP-FLOP CIRCUIT

This application is a continuation-in-part of application Ser. No. 882,563 filed July 7, 1986, now U.S. Pat. No. 4,785,206.

BACKGROUND OF THE INVENTION

The present invention relates to a transistor circuit, and more particularly to an input circuit of a type in which an input signal is compared with a reference voltage to detect a logic level of the input signal.

A signal input circuit of this type is widely employed in for example, a semiconductor memory as an adress input circuit and a data input circuit. It comprises an input amplifier including a flip-flop circuit having first and second input/output terminals, a first transistor supplied with an input signal and connected between the first input/output terminal of the flip-flop circuit and a reference terminal, and a second transistor supplied with the reference voltage and connected between the second input/output terminal of the flip-flop circuit and the reference terminal.

When the level of the input signal is larger than the reference voltage, the first transistor takes an internal resistance smaller than the second transistor, so that the first input/output terminal takes the low level. When the input signal takes the low level or a level that is smaller than the reference voltage, the first transistor is turned OFF or has a high internal resistance. As a result, the second input/output terminal takes the low level. The second transistor is in the conductive state regardless of whether or not the level of the input signal is larger than the reference voltage, and therefore, a d.c. current flows between power supply terminals through the second transistor and an internal load of the flip-flop circuit. The power consumption is thereby increased. Moreover, the potential at the second input/output terminal is determined by the resistance ratio between the second transistor and the internal load of the flip-flop circuit when the input signal takes the level higher than the reference voltage. In other words, the second input/output terminal assumes an intermediate level between the high level and the low level. For this reason, the potential difference between the first and second input/output terminals is not amplified sufficiently only by an output amplifier, so that another flip-flop circuit is required to produce and hold the high level and low level output signals. The circuit construction is thereby made complicated. Furthermore, if the level of the input signal varies after one of the first and second input/output terminals takes the low level, the potentials at the other input/output terminal is changed. In order to avoid this defect, the signal input circuit further includes first and second gates. The input signal is supplied through the first gate to the first transistor, and the reference voltage is supplied via the second gate to the second transistor. The first and second gates are opened by a clock signal only during a predetermined time period. This means that the circuit construction is further made complicated.

SUMMARY OF THE INVENTION

Therefore, an object of the present invention is to provide a transistor circuit in which the power consumption is reduced.

Another object of the present invention is to provide transistor circuit having a simplified circuit construction.

A transistor circuit according to one aspect of the present invention comprises a first transistor having a gate supplied with an input signal voltage; a second transistor supplied with a reference voltage; a first circuit of a flip-flop type including first and second input/output terminals, first and second common nodes, a third transistor connected between the first input/output terminal and the first common node and having a gate connected to the second input/output terminal, a fourth transistor connected between the second input/output terminal and the first common node and having a a gate connected to the first input/output terminal, a fifth transistor connected between the first input/output terminal and the second common node, and a sixth transistor connected between the second input/output terminal and the second common node; a second circuit including first and second input terminals, first and second output terminals, third and fourth common nodes, a seventh transistor connected between the first output terminal and the third common node and having a gate connected to the first input terminal, an eighth transistor connected between the second output terminal and the third common node and having a gate connected to the second input terminal, a ninth transistor connected between the first output terminal and the fourth common node, a tenth transistor connected between the second output terminal and the fourth common node, means for connecting the first and second input terminals to the first and second input/output terminals of the first circuit, respectively, and means for connecting the first and second output terminals to gates of the sixth and fifth transistors, respectively; an eleventh transistor having a gate connected to the second output terminal of the second circuit; a twelfth transistor having a gate connected to the first output terminal of the second circuit; a reference terminal; means for connecting the first and eleventh transistors in series between the second input/output terminal of the first circuit and the reference terminal; and means for connecting the second and twelfth transistors in series between the first input/output terminal of the first circuit and the reference terminal.

When the input signal voltage is larger than the reference voltage, the second input/output terminal of the first circuit and the first output terminal of the second circuit both take the low level, so that the twelfth transistor is turned OFF. Therefore, no d.c. current flows through the second transistor. The turned-OFF state of the twelfth transistor prevents lowering the potential level at the first input/output terminal and further does not change the potential at the first input/output terminal even when the input signal voltage drops to a level smaller than the reference voltage. When the input signal voltage is lower than the reference voltage, the first input/output terminal and the second output terminal both take the low level, so that the eleventh transistor is turned OFF. The potential level at the second input/output terminal does not change even if the input signal voltage is thereafter raised to become higher than the reference voltage.

A transistor circuit according to another aspect of the present invention comprises a first input terminal supplied with an input signal voltage, a second input terminal supplied with a reference voltage, a first inverter having input and output terminals, a second inverter having input and output terminals connected respectively to the output and input terminals of the first inverter, a reference terminal, first means coupled between the input terminal of the first inverter and the reference terminal and having a control terminal connected to the first input terminal for providing thereacross a first impedance representative of an amplitude of the input signal voltage, second means coupled between the input terminal of the second inverter and the reference terminal and having a control terminal connected to the second input terminal for providing thereacross a second impedance representative of an amplitude of the reference voltage, a third inverter having an input terminal connected to the input terminal of the first inverter and an output terminal, a fourth inverter having an input terminal connected to the input terminal of the second inverter and an output terminal, a first gate connected in series with the first means between the input terminal of the first inverter and the reference terminal and having a control terminal connected to the output terminal of the third inverter, a second gate connected in series with the second means between the input terminal of the second inverter and the reference terminal and having a control terminal connected to the output terminal of the fourth inverter, and third means coupled to the input terminals of the first and second inverters for producing an output signal having a first level when the first impedance is larger than the second impedance and a second level when the first impedance is smaller than the second impedance.

When the input signal voltage has an amplitude larger than the reference voltage, the output terminal of the first inverter, i.e., the input terminal of the second inverter, takes the high level, whereas the output of the fourth inverter takes the low level. The second gate is thereby closed. On the other hand, when the input signal voltage has an amplitude smaller than the reference voltage, the output terminal of the second inverter takes the high level and the output terminal of the third inverter takes the low level. As a result, the first gate is closed.

BRIEF DESCRIPTION OF THE DRAWINGS

The above and other objects, advantages and features of the present invention will be more apparent from the following description taken in conjunction with the accompanying drawings, in which.

Figure 1:
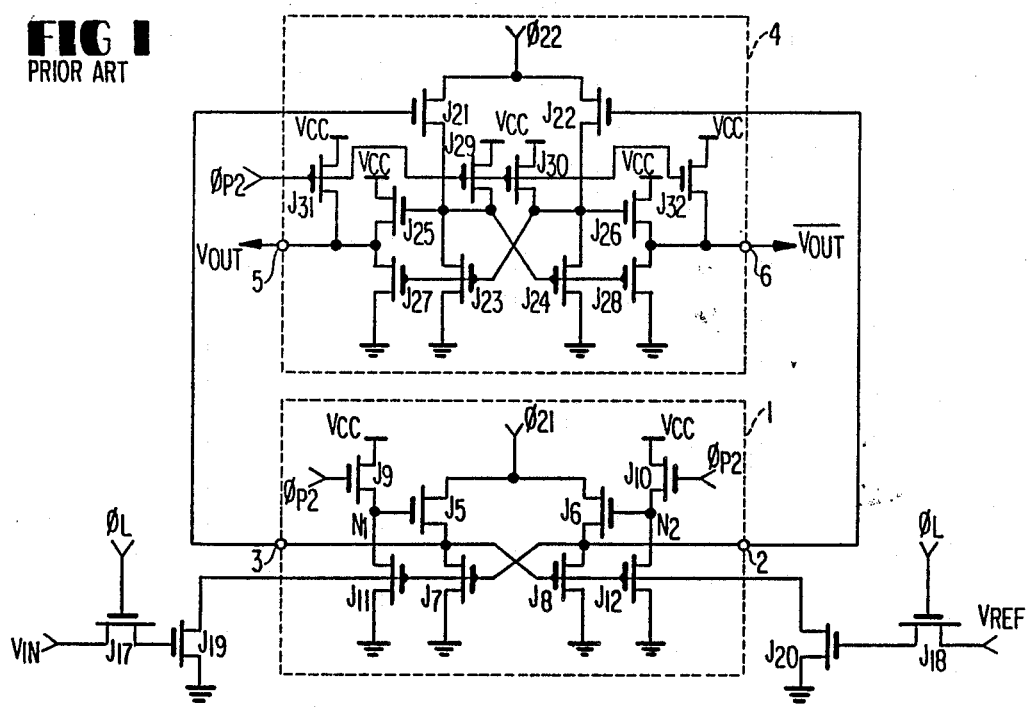
FIG. 1 is a circuit diagram showing prior art.

Incidentally, all the transistors shown in the drawings are N-channel insulated gate field effect transistors, but P-channel insulated gate field effect transistors or bipolar transistors of NPN type or PNP type may be employed.

DETAILED DESCRIPTION OF THE PRIOR ART

A signal input circuit according to prior art is shown in FIG. 1 in order to facilitate the understanding of the present invention. An input signal voltage $V_{IN}$ is supplied via a transistor $J_{17}$ to a transistor $J_{19}$, and a reference voltage $V_{ref}$ is supplied through a transistor $J_{18}$ to a transistor $J_{20}$.

An input amplifier 1 includes a first circuit of a flip-flop type and a second circuit. The first circuit has four transistors $J_5$ to $J_8$ and first and second input/output terminals 2 and 3. The transistors $J_5$ and $J_7$ form a first inverter and the transistors $J_6$ and $J_8$ form a second inverter. These first and second inverters are cross-coupled to form a flip-flop. That is, the input and output terminals of the first inverter are connected to the output and input terminals of the second inverter, respectively. The second circuit has four transistors $J_9$ to $J_{12}$, wherein the transistors $J_9$ and $J_{11}$ form a third inverter and the transistors $J_{10}$ and $J_{12}$ form a fourth inverter. The transistor $J_{19}$ is connected between the first input/output terminal 2 and a reference terminal (ground terminal) and the transistor $J_{20}$ is connected between the second input/output terminal 3 and the reference terminal. The outputs of the input amplifier 1 are supplied to an output amplifier 4.

In an initial state, the transistors $J_9$ and $J_{10}$ are turned ON by a precharge signal $\phi_{p2}$ to precharge nodes $N_1$ and $N_2$ to the high level. The transistors $J_5$ and $J_6$ are thereby turned ON, but at this time, a first activating signal $\phi_{21}$ is in the low level, and therefore the input/output terminals 2 and 3 take the low level. After the precharge signal $\phi_{p2}$ changes to the low level, the activating signal $\phi_{21}$ changes to the high level, so that the transistors $J_5$ and $J_6$ intend to raise the potentials at the input/output terminals 3 and 2, respectively. At this time, when the internal resistance of the transistor $J_{19}$ is smaller than that of $J_{20}$ due to the fact that the input signal voltage $V_{IN}$ is higher than the reference $V_{ref}$, the potential raising rate at the second input/output terminal 3 is faster than that at the first input terminal 2. That is, the potential difference occurs between the input/output terminals 2 and 3. This potential difference is amplified and the result is fed back to the input/output terminals 2 and 3 by the transistors $J_7$ and $J_8$ and back to the nodes $N_1$ and $N_2$ by the transistors $J_{11}$ and $J_{12}$. As a result, the transistors $J_6$, $J_7$ and $J_{11}$ are turned OFF and the transistors $J_8$ and $J_{12}$ are turned ON. The first input/output terminal 2 thereby takes the low level. When the input signal voltage $V_{IN}$ is smaller than the reference voltage, the transistors $J_5$, $J_8$ and $J_{12}$ are turned OFF and the transistors $J_7$ and $J_{11}$ are turned ON. Therefore, the second input/output terminal 3 takes the low level.

However, the transistor $J_{20}$ is in the conductive state by the reference voltage $V_{ref}$ regardless of the level of the input signal $V_{IN}$. In addition, the transistor $J_5$ is in the conductive state when the input signal voltage $V_{IN}$ is higher than the reference voltage $V_{ref}$. For this reason, a d.c. current flows through the transistors $J_5$ and $J_{20}$ to cause large power consumption. Moreover, the potential at the input/output terminal 3 is determined by the internal resistances of the transistors $J_5$ and $J_{20}$ and thus takes an intermediate level between the high level and the low level. The potential differences between the input/output terminals 2 and 3 is amplified by an output amplifier 4. However, if the output amplifier 4 is not provided with a flip-flop circuit including transistors $J_{23}$ to $J_{28}$, a differential amplifier composed of transistors $J_{21}$ and $J_{22}$ cannot raise an output signal $V_{OUT}$ to the high level due to the fact that the potential at the gate of the transistor $J_{21}$ is relatively low. Therefore, the output amplifier 4 further includes the flip-flop circuit composed of the transistors $J_{23}$ to $J_{28}$ to produce the high level output $V_{OUT}$ at a first signal output terminal 5 and the low level output $\overline{V_{OUT}}$ at a second signal output terminal 6. The transistors $J_{29}$ to $J_{32}$ are precharge transistors for precharging nodes $N_3$ and $N_4$ and the output terminals 5 and 6 to ground level in response to the precharge signal $\phi_{p2}$. The output amplifier 4 is activated by a second activating signal $\phi_{22}$.

The input signal voltage $V_{IN}$ often varies after the first activating signal $\phi_{21}$ changes to the high level. If the input signal voltage $V_{IN}$ varies from the low level to a level that is higher than the reference voltage $V_{ref}$, the transistor $J_{19}$ is turned ON to lower the potential at the terminal 2, so that the output signals $V_{OUT}$ and $\overline{V_{OUT}}$ change their levels. In order to overcome this defect, the transistors $J_{17}$ and $J_{18}$ are provided and driven by a latch clock signal $\phi_L$. The input signal voltage $V_{IN}$ and the reference voltage $V_{ref}$ are supplied respectively to the transistors $J_{19}$ and $J_{20}$ only when the latch signal $\phi_L$ takes the high level.

As described above, the signal input circuit shown in FIG. 1 consumes a large power and has a complicated circuit construction.

DETAILED DESCRIPTION OF THE INVENTION

Figure 2:
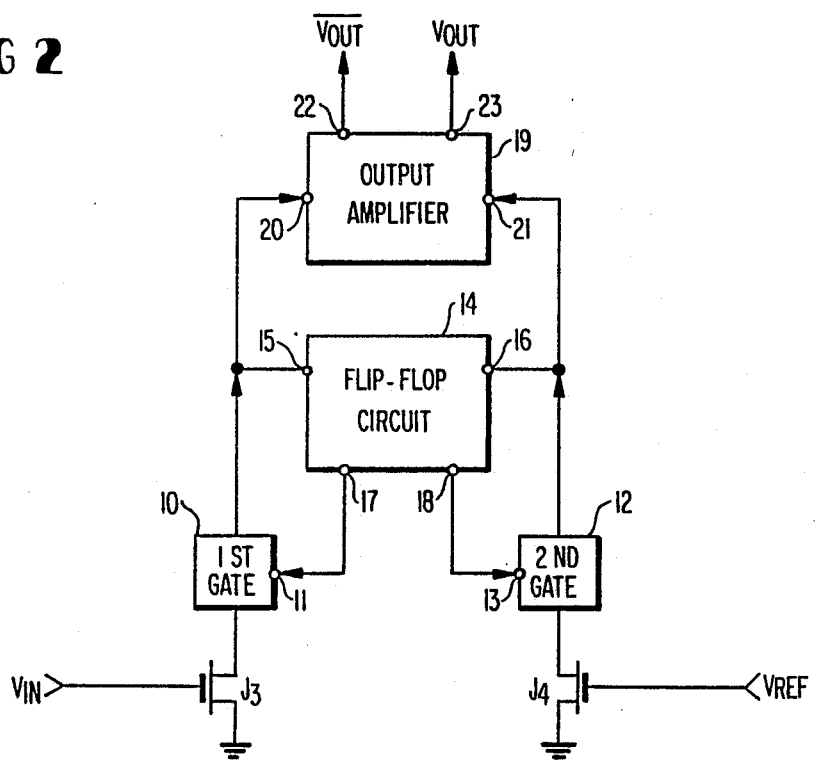
FIG. 2 is a block diagram showing an embodiment of the present invention.

Referring to FIG. 2, a transistor circuit according to an embodiment of the present invention includes an input amplifier 14 having first to fourth terminals 15 to 18. The first and second terminals 15 and 16 are coupled to first and second input/output terminals of a flip-flop circuit (not shown in this drawing) provided in the input amplifier 14. A transistor $J_3$ and a first gate 10 are connected in series between the first terminal 15 of the input amplifier 14 and a reference terminal (the ground terminal in this embodiment). An input voltage $V_{IN}$ is supplied to a control electrode (i.e., a gate electrode) of the transistor $J_3$. A transistor $J_4$ and a second gate 12 are connected in series between a second terminal 16 of the input amplifier 14 and the reference terminal. The transistor $J_4$ is supplied with a reference voltage $V_{ref}$ at its control (gate) electrode. The input amplifier 14 produces at the third terminal 17 a potential relative to the potential at the second terminal 16, which is in turn supplied to a control terminal 11 of the first gate 10. The input amplifier 14 further produces at the fourth terminal 18 a potential relative to the potential at the first terminal 15. The potential at the terminal 18 is supplied to a control terminal 13 of the second gate 12. The terminals 15 and 16 of the input amplifier circuit 14 are connected to input terminals 20 and 21 of an output amplifier 19, respectively, so that an output signal $V_{OUT}$ and an inverted output signal $\overline{V_{OUT}}$ are derived from signal output terminals 23 and 22, respectively.

In an initial state, the first and second gates 10 and 12 are opened. Therefore, the difference in internal resistance between the transistors $J_3$ and $J_4$ caused by the level difference between the input signal voltage $V_{IN}$ and the reference voltage $V_{ref}$ is transferred between the first and second terminals 15 and 16. One of the terminal 15 and 16 thereby takes the low level. When the terminal 15 takes the low level, the second gate 12 is closed by the potential at the terminal 18. Accordingly, a d.c. current does not flow through the transistor $J_4$, and further the lowering of the potential at the terminal 16 does not occur. The output amplifier 20 thus produces the high level output $V_{OUT}$ without another flip-flop circuit. When the second terminal 16 takes the low level, the first gate 10 is closed. Therefore, the change in potential at the first input terminal 15 does not occur even when the input signal voltage $V_{IN}$ varies.

Figure 3:
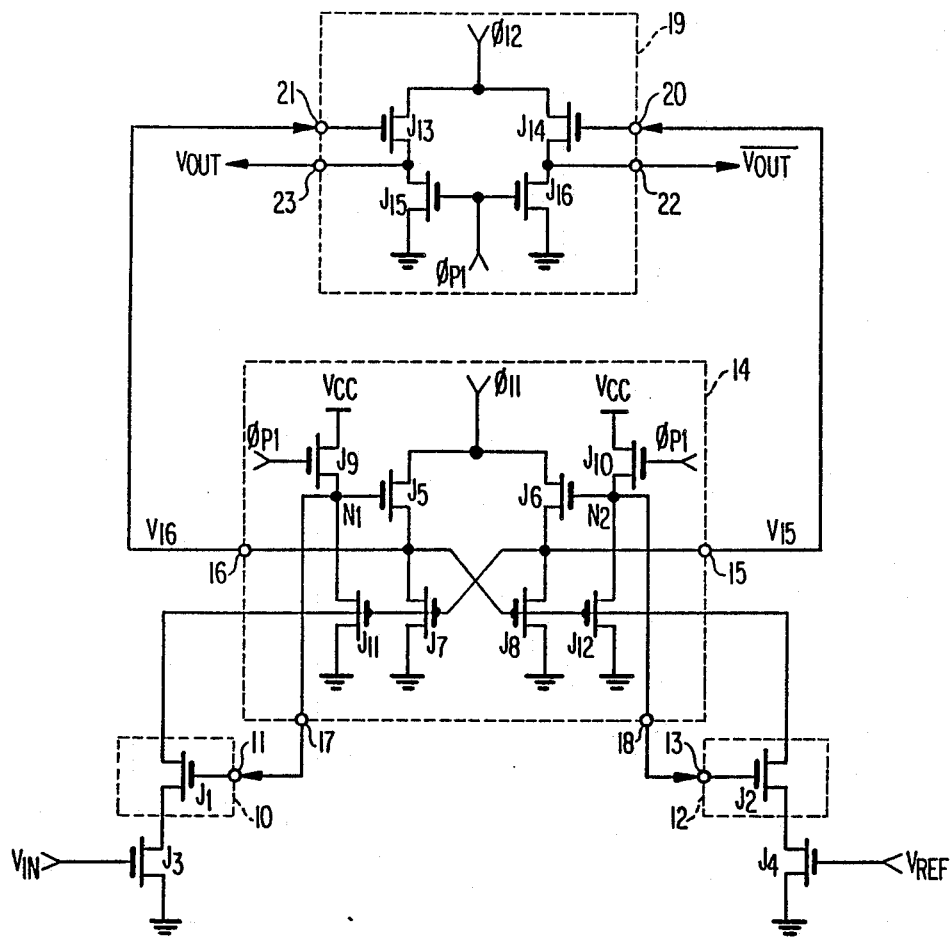
FIG. 3 is a circuit diagram representing in detail a circuit construction of FIG. 2.

The above features and advantages will be described in detail with reference to the circuit diagram shown in FIG. 3. In FIG. 3, the same constituents as those shown in FIG. 2 are denoted by the same references and symbols to omit their further description.

The first and second gates 10 and 12 are composed respectively of transistor $J_1$ and $J_2$ whose gate electrodes are connected respectively to the control terminals 11 and 13. The input amplifier 14 includes a first circuit of a flip-flop type composed of four transistors $J_5$ to $J_8$ and a second circuit composed of four transistors $J_9$ to $J_{11}$. The transistors $J_5$ and $J_7$ form a first inverter and the transistors $J_6$ and $J_8$ form a second inverter. These first and second inverters are cross-coupled to thereby form a flip-flop. Namely, the input and output terminals of the first inverter are connected to the output and input terminals of the second inverter, respectively. The transistors $J_9$ and $J_{11}$ form a third inverter having its input terminal connected to the input terminal of the first inverter ($J_5$, $J_7$), i.e., the output terminal of the second inverter ($J_6$, $J_8$). The transistors $J_{10}$ and $J_{12}$ form a fourth inverter having its input terminal connected to the input terminal of the second inverter ($J_6$, $J_8$), i.e., the output terminal of the first inverter ($J_5$, $J_7$). The transistors $J_5$, $J_6$, $J_9$ and $J_{10}$ operate as load transistors of the respective inverters. The transistors $J_9$ and $J_{11}$ are connected in series between power supply terminals (Vcc and GND). The transistors $J_{10}$ and $J_{12}$ are also connected in series between the power supply terminals. The transistors $J_9$ and $J_{10}$ are supplied with a precharge signal $\phi_{p1}$. The connection point $N_1$ of the transistors $J_9$ and $J_{11}$ and the connection point $N_2$ of the transistors $J_{10}$ and $J_{12}$ are led out, respectively, as first and second output terminals of the second circuit and connected respectively to the control terminals 11 and 13 of the gates 10 and 12 through the terminals 17 and 18. The transistors $J_5$ and $J_7$ and those $J_6$ and $J_8$ are connected in series, respectively, between a first activating signal ($\phi_{11}$) supply terminal and GND. The connection point of the transistors $J_5$ and $J_7$ is led out as a second input/output terminal of the first (flip-flop) circuit and connected to the second terminal 16 and further to the gate electrode of the transistor $J_8$. The terminal 16 is further connected to the gate electrode of the transistor $J_{12}$, i.e., a second input terminal of the second circuit. The connection point of the transistors $J_6$ and $J_8$ is led out as a first input/output terminal of the first (flip-flop) circuit and connected to the first terminal 15 and further to the gate electrode of the transistor $J_7$. The terminal 15 is further connected to the gate electrode of the transistor $J_{11}$, i.e., a first input terminal of the second circuit. The nodes $N_1$ and $N_2$ are led out, respectively, as first and second output terminals of the second circuit and connected respectively to the gate electrodes of the transistors $J_5$ and $J_6$. The output amplifier 19 includes four transistors $J_{13}$ to $J_{16}$. The transistors $J_{13}$ and $J_{15}$ and those $J_{14}$ and $J_{16}$ are connected in series, respectively, and a second activating signal $\phi_{12}$ is supplied to these series connection circuits. The gate electrodes of $J_{13}$ and $J_{14}$ are connected respectively to the input terminals 21 and 20. The connection point of $J_{13}$ and $J_{15}$ and that of $J_{14}$ and $J_{16}$ are connected respectively to the signal output terminals 23 and 22. The transistors $J_{15}$ and $J_{16}$ are supplied with the precharge signal $\phi_{p1}$ at their gate electrodes.

Figure 4:
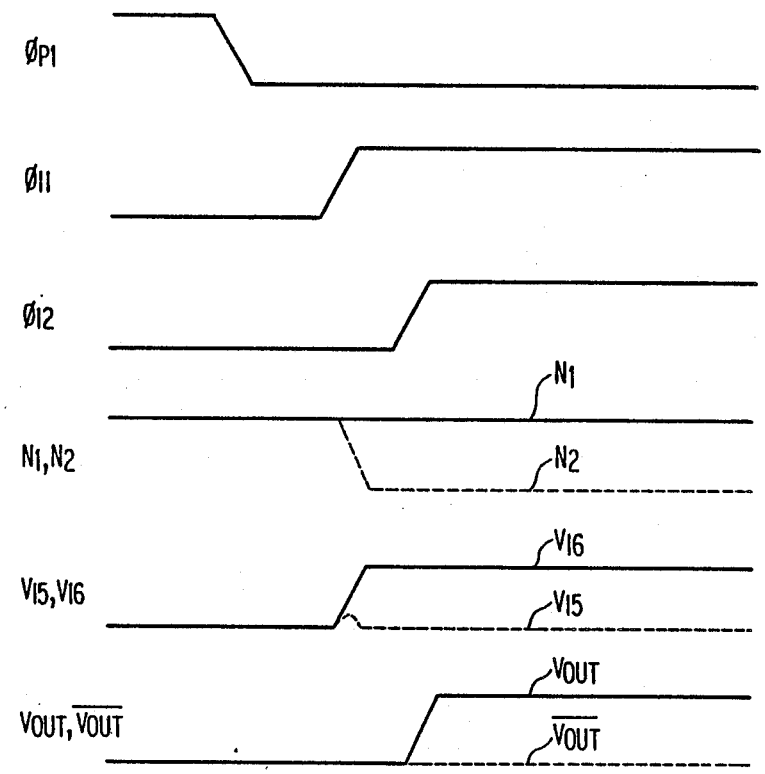
FIG. 4 is a timing chart for explaining an operation of the circuit shown in FIG. 3.

FIG. 4 shows a timing chart for explaining an operation of the circuit shown in FIG. 3. In an initial state, the precharge signal $\phi_{p1}$ takes the high level to turn the transistors $J_9$, $J_{10}$, $J_{15}$ and $J_{16}$ ON. The nodes $N_1$ and $N_2$ are thereby charged to the high level and the output signals $V_{OUT}$ and $\overline{V_{OUT}}$ take the low level. Since the nodes $N_1$ and $N_2$ take the high level, the transistors $J_5$ and $J_6$ are turned ON, but at this time the first activating signal $\phi_{11}$ is in the low level, so that the potentials at the first and second terminals 15 and 16 ($V_{15}$, $V_{16}$) take the low level. The high level at the nodes $N_1$ and $N_2$ turns the transistors $J_1$ and $J_2$ ON. The first and second gates 10 and 12 are thus in the opened state.

After the precharge signal $\phi_{p1}$ changes to the low level to turn the transistors $J_9$ and $J_{10}$ OFF, the first activating signal $\phi_{11}$ is inverted to the high level. Therefore, the transistors $J_5$ and $J_6$ intend to raise the potentials at the terminals 15 and 16. Assuming that the input signal voltage $V_{IN}$ is higher than the reference voltage $V_{ref}$, the transistor $J_3$ has its internal resistance smaller than the transistor $J_4$. Therefore, the raising rate of potential at the second terminal 16 is higher than that at the first terminal 15 to produce the difference in potential between the terminals 15 and 16 as shown by $V_{15}$ and $V_{16}$ in FIG. 4. This potential difference is amplified and fed back to the terminals 15 and 16 by the transistors $J_8$ and $J_7$. The potential $V_{15}$ at the first terminal 15 thereby takes the low level, and the potential $V_{16}$ at the second terminal 16 takes near the high level. That is, the first inverter ($J_5$, $J_7$) inverts the low level input supplied thereto and produces the high level at the terminal 16, and the second inverter ($J_6$, $J_8$) inverts the high level input supplied thereto and produces the low level at the terminal 15. The potential difference between the terminals 15 and 16 is also amplified and fed back to the nodes $N_1$ and $N_2$ by the transistors $J_{11}$ and $J_{12}$. The potential at the node $N_2$ is thereby inverted to the low level by the fourth inverter ($J_{10}$, $J_{12}$) and the potential at the node $N_1$ is held at the high level, since the third inverter ($J_9$, $J_{11}$) receives the low level input. The low level at the node $N_2$ turns the transistor $J_2$ OFF.

Thus, when the input voltage $V_{IN}$ is higher than the reference voltage $V_{ref}$, the transistors $J_2$, $J_6$, $J_7$, $J_9$, $J_{10}$ and $J_{11}$ are in the OFF-state and the transistors $J_1$, $J_5$, $J_8$ and $J_{12}$ are in the ON-state. Accordingly, no d.c. current path is formed. The power consumption is thereby reduced. Moreover, the OFF-state of the transistor $J_2$ prevents the lowering of the potential $V_{16}$ at the second terminal 16 regardless of the conductive state of the transistor $J_4$. The potential $V_{16}$ holds near the high level. Accordingly, the transistor $J_{13}$ in the output amplifier 19 responds to the high level activating signal $\phi_{12}$ and raises the output signal $V_{OUT}$ near the high level without another flip-flop circuit which would be required in the prior art circuit. The transistors $J_{15}$ and $J_{16}$ are in the OFF-state by the low level precharge signal $\phi_{p1}$ and the transistor $J_{14}$ is also in the OFF-state by the low level precharge signal $\phi_{p1}$ and the transistor $J_{14}$ is also in the OFF-state by the low level output $V_{15}$. Therefore, the inverted output signal $\overline{V_{OUT}}$ holds the low level.

Since the transistors $J_2$, $J_7$ and $J_{11}$ are in the OFF-state, substantial change of the potential $V_{16}$ does not occur even when the input voltage $V_{IN}$ goes to a level that is smaller than the reference voltage $V_{ref}$.

Assuming that the input signal voltage $V_{IN}$ is lower than the reference voltage $V_{ref}$, when the first activating signal $\phi_{11}$ changes to the high level, the raising rate of the potential $V_{15}$ is higher than that of the potential $V_{16}$, so that the transistors $J_7$ and $J_{11}$ are turned ON to change the potentials at the node $N_1$ and terminal 16 to the low level. The transistor $J_1$ is thereby turned OFF to close the first gate 10. The output signal $V_{OUT}$ is held at the low level and the inverted output signal $\overline{V_{OUT}}$ is changed to the high level. Since the transistor $J_1$ is in the OFF-state, any potential change does not occur in the input amplifier 14 even when the input signal voltage increases to a level that is higher than the reference voltage.

As described above, the signal input circuit shown in FIG. 3 reduces power consumption and has a simplified circuit construction. Moreover, since the latch clock signal $\phi_L$ (see FIG. 1) is not required, the circuit construction is further simplified and an operation speed is increased.

Figure 5:
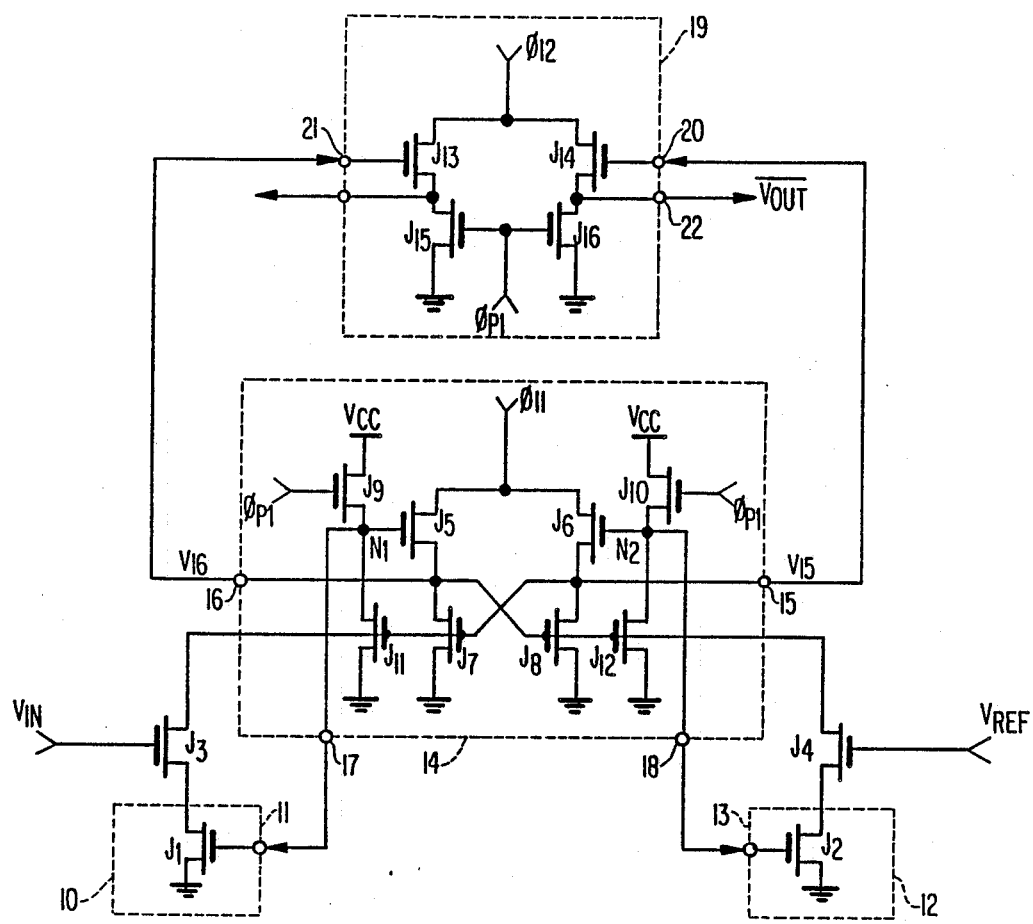
FIG. 5 is a circuit diagram showing another embodiment of the present invention.

FIG. 5 shows another embodiment of the present invention, in which the same constituents as those in FIG. 3 are represented by the same references to omit their further description. In this embodiment, the first gate 10 is inserted between the transistor $J_3$ and the ground terminal and the second gate 12 is inserted between the transistor $J_3$ and the ground. Therefore, the same effects as those in FIG. 3 are also obtained in this embodiment.

Figure 6:
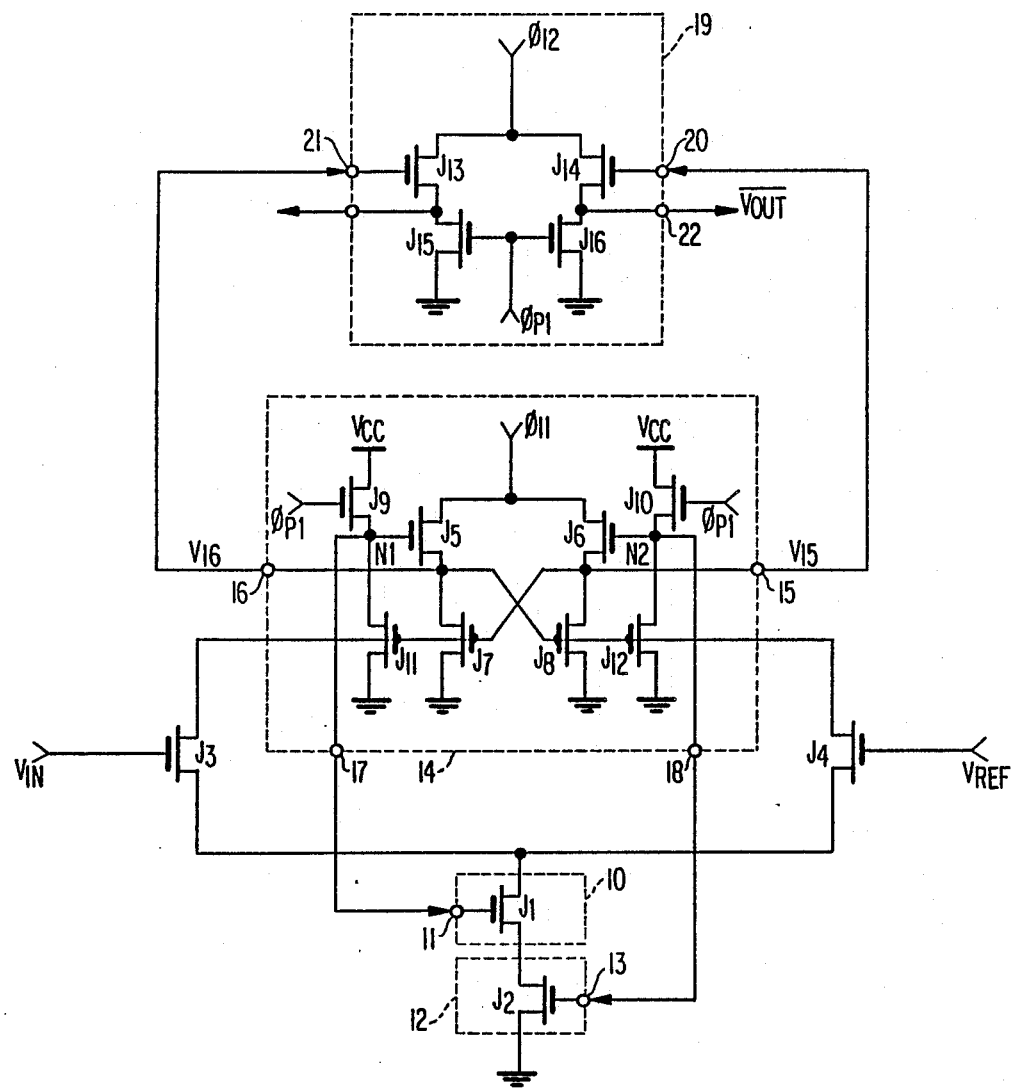
FIG. 6 is a circuit diagram showing still another embodiment of the present invention.

FIG. 6 shows still another embodiment. In this embodiment, one of the source and drain of the transistor $J_3$ is connected in common to one of the source and drain of the transistor $J_4$, and the common connection point is connected to the ground via a series circuit of the first and second gates 10 and 12. Other circuit constructions are the same as FIG. 3. In this embodiment, when one of the gates 10 and 30 is closed, both the input signal voltage $V_{IN}$ and the reference voltage $V_{ref}$ are disconnected from the input amplifier 14.

The present invention is not limited to the above embodiments, but may be modified and changed without departing from the scope and spirit of the present invention. For example, the outputs of the input amplifier 14 can be led out from the nodes $N_1$ and $N_2$ and then supplied to the output amplifier 19.

What is claimed is:

1. A transistor circuit comprising a first insulated-gate field effect transistor having a gate supplied with an input signal voltage; a second insulated-gate field effect transistor having a gate supplied with a reference voltage; a first circuit of a flip-flop type including first and second input/output terminals, first and second common nodes, a third insulated-gate field effect transistor having a source-drain path connected between said first input/output terminal and said first common node and a gate connected to said second input/output terminal, a fourth insulated-gate field effect transistor having a source-drain path connected between said second input/output terminal and said first common node and a gate connected to said first input/output terminal, a fifth insulated-gate field effect transistor having a source-drain path connected between said first input/output terminal and said second common node, and a sixth insulated field effect transistor having a source-drain path connected between said second input/output terminal and said second common node; a second circuit including first and second input terminals, first and second output terminals, third and fourth common nodes, a seventh insulated-gate field effect transistor having a source-drain path connected between said first output terminal and said third common node and a gate connected to said first input terminal, an eighth insulated-gate field effect transistor having a source-drain path connected between said second output terminal and said third common node and a gate connected to said second input terminal, a ninth insulated-gate field effected transistor having a source-drain path connected between said first output terminal and said fourth common node, a tenth insulated-gate field effect transistor having a source-drain path connected between said second output terminal and said fourth common node, means for connecting said first and second input terminals to said first and second input/output terminals of said first circuit, respectively, and means for connecting said first and second output terminals to gates of said sixth and fifth transistors, respectively; an eleventh insulated-gate field effect transistor having a gate connected to said second output terminal of said second circuit; a twelfth insulated-gate field effect transistor having a gate connected to said first output terminal of said second circuit; a reference terminal; means for connecting said source-drain paths of said first and eleventh transistors in series between said second input/output terminal of said first circuit and said reference terminal; and means for connecting said source-drain paths of said second and twelfth transistors in series between said first input/output terminal of said first circuit and said reference terminal.

2. The transistor circuit as claimed in claim 1, wherein said first and third common nodes are connected to said reference terminal, said second common node being supplied with an activating signal, said fourth common node being connected to a power supply terminal, and gates of said ninth and tenth transistors being supplied with a precharge signal before said activating signal.

3. The circuit as claimed in claim 1, wherein said eleventh transistor is connected between said second input/output terminal and said first transistor and said twelfth transistor is connected between said first input/output terminal and said second transistor.

4. The circuit as claimed in claim 1, wherein said eleventh transistor is connected between said first transistor and said reference terminal and said twelfth transistor is connected between said second transistor and said reference terminal.

5. The circuit as claimed in claim 1, wherein said first transistor is connected between said second input/output terminal and a circuit node and said second transistor is connected between said first input/output terminal and said circuit node, said eleventh and twelfth transistors being connected in series between said circuit node and said reference terminal.

6. A transistor circuit comprising a first input terminal supplied with an input signal voltage, a second input terminal supplied with a reference voltage, a first inverter having input and output terminals, a second inverter having input and output terminals connected respectively to said output and input terminals of said first inverter, a reference terminal, a first means coupled between said input terminal of said first inverter and said reference terminal and having a control terminal connected to said first input terminal for providing thereacross a first impedance representative of an amplitude of said input signal voltage, second means coupled between said input terminal of said second inverter and said reference terminal and having a control terminal connected to said second input terminal for providing thereacross a second impedance representative of an amplitude of said reference voltage, a third inverter having an input terminal, which is connected to said input terminal of said first inverter, and an output terminal, a fourth inverter having an input terminal, which is connected to said input terminal of said second inverter, and an output terminal, a first gate connected in series with said first means between said input terminal of said first inverter and said reference terminal and having a control terminal connected to said output terminal of said third inverter, a second gate connected in series with said second means between said input terminal of said second inverter and said reference terminal and having a control terminal connected to said output terminal of said fourth inverter, and third means coupled to said input terminals of said first and second inverters for producing an output signal having a first level when said first impedance is larger than said second impedance and a second level when said first impedance is smaller than said second impedance.

7. The circuit as claimed in claim 6, wherein each of said first and second means and said first and second gates is composed of a transistor.

* * * * *